（12）United States Patent
Park et al.

(10) Patent No.: US 12,002,726 B2
(45) Date of Patent: Jun. 4, 2024

(54) SEMICONDUCTOR PACKAGE AND METHOD OF MANUFACTURE

(71) Applicant: SAMSUNG ELECTRONICS CO., LTD., Suwon-si (KR)

(72) Inventors: Jinwoo Park, Seoul (KR); Jongho Lee, Hwaseong-si (KR); Yeongkwon Ko, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/112,715

(22) Filed: Feb. 22, 2023

(65) Prior Publication Data

US 2023/0197549 A1 Jun. 22, 2023

Related U.S. Application Data

(63) Continuation of application No. 17/177,725, filed on Feb. 17, 2021, now Pat. No. 11,610,828.

(30) Foreign Application Priority Data

Sep. 7, 2020 (KR) .......................... 10-2020-0113839

(51) Int. Cl.
*H01L 23/31* (2006.01)
*H01L 21/56* (2006.01)
(Continued)

(52) U.S. Cl.
CPC ........ *H01L 23/3157* (2013.01); *H01L 21/568* (2013.01); *H01L 23/293* (2013.01);
(Continued)

(58) Field of Classification Search
CPC ......... H01L 2224/1012; H01L 2224/14; H01L 2224/16225; H01L 2224/8185;
(Continued)

(56) References Cited

U.S. PATENT DOCUMENTS

| 2010/0190294 | A1 | 7/2010 | Simmons-Matthews |
| 2015/0262975 | A1 | 9/2015 | Kawato |
| 2019/0164783 | A1* | 5/2019 | Huang ................... H01L 24/20 |

FOREIGN PATENT DOCUMENTS

| JP | 20010135598 A | 5/2001 |
| JP | 4812525 A | 12/2007 |

(Continued)

*Primary Examiner* — Timor Karimy
(74) *Attorney, Agent, or Firm* — Fish & Richardson P.C.

(57) ABSTRACT

A method of manufacture for a semiconductor package includes; forming a molding member on side surfaces of the semiconductor chips, using an adhesive to attach a carrier substrate to upper surfaces of the molding member and the semiconductor chips, using a first blade having a first blade-width to cut away selected portions of the carrier substrate and portions of the adhesive underlying the selected portions of the carrier substrate, and using the first blade to partially cut into an upper surface of the molding member to form a first cutting groove, wherein the selected portions of the carrier substrate are dispose above portions of the molding member between adjacent ones of semiconductor chips, using a second blade having a second blade-width narrower than the first blade-width to cut through a lower surface of the molding member to form a second cutting groove, wherein a combination of the first cutting groove and the second cutting groove separate a package structure including a semiconductor chip supported by a cut portion of the carrier substrate and bonding the package structure to an upper surface of a package substrate.

20 Claims, 14 Drawing Sheets

(51) Int. Cl.
   *H01L 23/00*     (2006.01)
   *H01L 23/29*     (2006.01)
   *H01L 23/498*    (2006.01)
   *H01L 25/00*     (2006.01)
   *H01L 25/18*     (2023.01)

(52) U.S. Cl.
   CPC .. *H01L 23/49816* (2013.01); *H01L 23/49827* (2013.01); *H01L 24/16* (2013.01); *H01L 25/18* (2013.01); *H01L 25/50* (2013.01); *H01L 2224/1012* (2013.01); *H01L 2224/14* (2013.01); *H01L 2224/16225* (2013.01); *H01L 2224/8185* (2013.01)

(58) Field of Classification Search
   CPC ......... H01L 25/18; H01L 25/50; H01L 24/16; H01L 21/568; H01L 23/3157; H01L 23/293; H01L 23/49816; H01L 23/49827
   See application file for complete search history.

(56) References Cited

FOREIGN PATENT DOCUMENTS

| | | | |
|---|---|---|---|
| JP | 20140011289 | A | 1/2014 |
| JP | 6571437 | A | 2/2017 |
| JP | 2020027850 | * | 8/2018 |
| JP | 20200027850 | A | 2/2020 |
| KR | 1824727 | A | 9/2017 |

* cited by examiner

SEMICONDUCTOR PACKAGE AND METHOD OF MANUFACTURE

CROSS-RELATED APPLICATION

This is a Continuation of U.S. application Ser. No. 17/177,725, filed Feb. 17, 2021, and a claim of priority is made to Korean Patent Application No. 10-2020-0113839 filed on Sep. 7, 2020, in the Korean Intellectual Property Office (KIPO), the subject matter of which is hereby incorporated by reference.

BACKGROUND

1. Field

Embodiments of the inventive concept relate generally to semiconductor packages and methods for manufacturing the same. More particularly, embodiments of the inventive concept relate to flip-chip type semiconductor packages and methods for manufacturing the same.

2. Description of the Related Art

Flip-chip type semiconductor packages generally include a package substrate, a semiconductor chip, and conductive bumps interposed between the package substrate and the semiconductor chip. The conductive bumps may be used to electrically connect the semiconductor chip with a conductive on the package substrate using a reflow process.

However, the semiconductor chip and the package substrate may be constructed of various and different materials having different coefficients of thermal expansion. Accordingly, there is some risk that thermal stress applied to the semiconductor chip, an interposer and/or the package substrate may cause material(s) warpage.

SUMMARY

Embodiments of the inventive concept provide semiconductor packages more resistant to thermal stress potentially causing material(s) warpage. Embodiments of the inventive concept also provide methods of manufacture for such semiconductor packages.

In some embodiments, a semiconductor package may include; a package substrate, an interposer disposed on an upper surface of the package substrate, a first semiconductor chip and a stacked plurality of second semiconductor chips disposed on an upper surface of the interposer, and a molding member around side surfaces of the first semiconductor chip and the stacked plurality of second semiconductor chips. Here, the molding member may include a protruding sidewall including an upper end that extends horizontally outward and is vertically offset below an upper surface of the molding member by a first distance, a lower end that extends horizontally outward and is vertically offset above a lower surface of the molding member by a second distance, and an outer side surface vertically extending between the upper end and the lower end, wherein an upper protruding width of the upper end is greater than a lower protruding width of the lower end.

In some embodiments, a semiconductor package may include; a package substrate, an interposer disposed on an upper surface of the package substrate, a first semiconductor chip disposed on an upper surface of the interposer, a second semiconductor chip disposed on the upper surface of the interposer; and a molding member includes an upper surface, an upper portion, a lower portion and a protruding sidewall, wherein the molding member is molded around side surfaces of the first semiconductor chip and the second semiconductor chip. The protruding sidewall may include an upper end vertically offset below the upper surface of the molding member, and have a width greater than a width of the upper portion of the molding member.

In some embodiments, a method of manufacture for a semiconductor package may include; arranging a first semiconductor chip, a first stacked plurality of second semiconductor chips and a second stacked plurality of second semiconductor chips on an upper surface of an interposer, forming a molding member on side surfaces of the first semiconductor chips, the first stacked plurality of second semiconductor chips and the second stacked plurality of second semiconductor chips, using an adhesive to attach a carrier substrate to an upper surface of the molding member, an upper surface of the first semiconductor chip, an upper surface of the first stacked plurality of second semiconductor chips and an upper surface of the second stacked plurality of second semiconductor chips, using a first blade having a first blade-width to cut away selected portions of the carrier substrate and cut away portions of the adhesive underlying the selected portions of the carrier substrate, and using the first blade to partially cut into an upper surface of the molding member to form a first cutting groove, wherein the selected portions of the carrier substrate are dispose above portions of the molding member between the first stacked plurality of second semiconductor chips and the second stacked plurality of second semiconductor chips, using a second blade having a second blade-width narrower than the first blade-width to cut through the interposer and at least partially into a lower surface of the molding member to form a second cutting groove, wherein a combination of the first cutting groove and the second cutting groove separate a package structure including a cut portion of the interposer, the first semiconductor chip and the first stacked plurality of second semiconductor chips, collectively supported by a cut portion of the carrier substrate and bonding the package structure to an upper surface of a package substrate.

In some embodiments, a method of manufacture for a semiconductor package may include; forming a molding member on side surfaces of the semiconductor chips, using an adhesive to attach a carrier substrate to upper surfaces of the molding member and the semiconductor chips, using a first blade having a first blade-width to cut away selected portions of the carrier substrate and portions of the adhesive underlying the selected portions of the carrier substrate, and using the first blade to partially cut into an upper surface of the molding member to form a first cutting groove, wherein the selected portions of the carrier substrate are dispose above portions of the molding member between adjacent ones of semiconductor chips, using a second blade having a second blade-width narrower than the first blade-width to cut through a lower surface of the molding member to form a second cutting groove, wherein a combination of the first cutting groove and the second cutting groove separate a package structure including a semiconductor chip supported by a cut portion of the carrier substrate, and bonding the package structure to an upper surface of a package substrate.

BRIEF DESCRIPTION OF THE DRAWINGS

The inventive concept may be more clearly understood upon consideration of certain embodiments illustrated in the accompanying drawings, in which.

DETAILED DESCRIPTION

Throughout the written description and drawings, like reference numbers and labels are used to denote like or similar elements, components, steps and/or features. Throughout the written description, certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
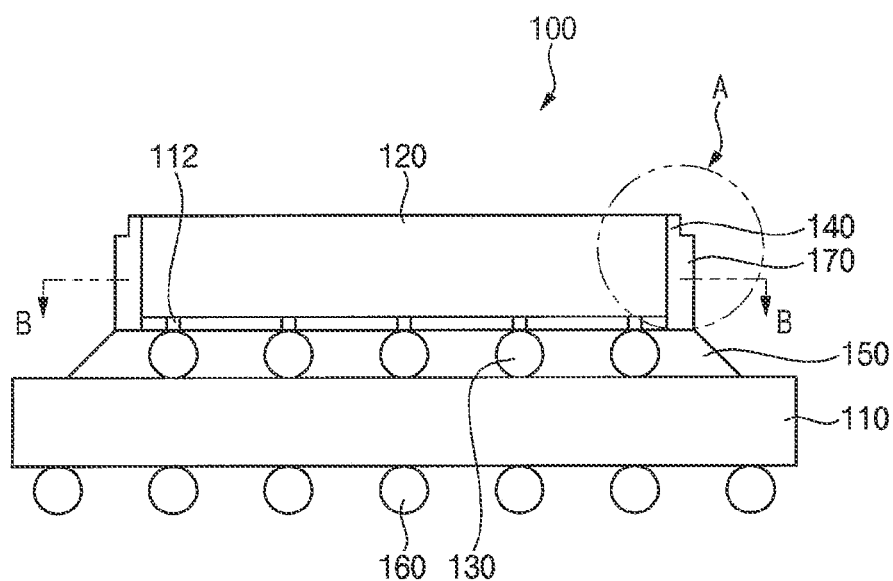
FIG. 1 is a cross-sectional view illustrating a semiconductor package according to embodiments of the inventive concept.
Figure 2:
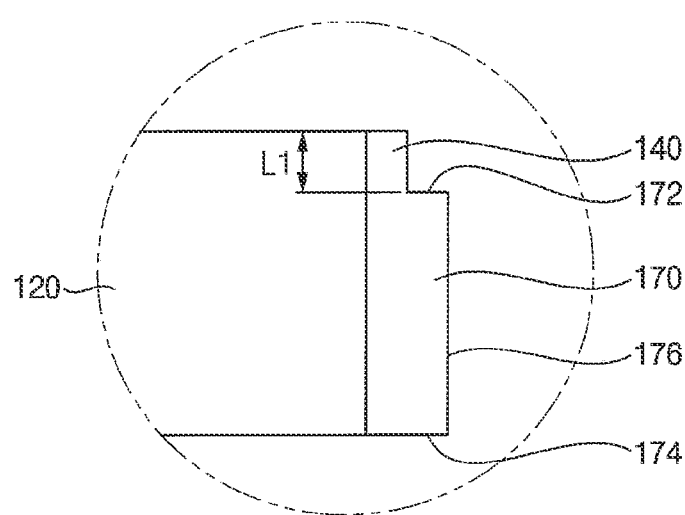
FIG. 2 is an enlarged, cross-sectional view of portion "A" in FIG. 1.

Figure (FIG. 1 is a cross-sectional view illustrating a semiconductor package 100 according to embodiments of the inventive concept. FIG. 2 is an enlarged, cross-sectional view illustrating portion "A" in FIG. 1, and FIG. 3 is a cross-sectional view taken along line B-B' in FIG. 1.

Figure 3:
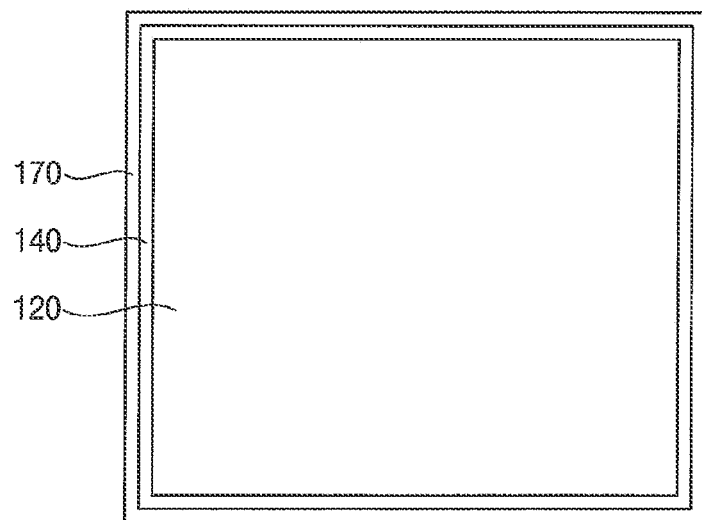
FIG. 3 is a cross-sectional view taken along line B-B' in FIG. 1.

Referring to FIGS. 1, 2 and 3, the semiconductor package 100 may include a package substrate 110, a semiconductor chip 120, conductive bumps 130, a molding member 140, an underfilling layer 150 and external terminals 160.

The package substrate 110 may include an insulation substrate and a conductive pattern, wherein the conductive pattern may be arranged upon and/or within the insulation substrate. Here, the conductive pattern may include an upper conductive pattern associated with (e.g., disposed on and/or exposed by) an upper surface of the package substrate 110, and/or a lower conductive pattern associated with a lower surface of the package substrate 110.

The semiconductor chip 120 may be disposed (e.g., arranged over and/or mounted on) the upper (or active) surface of the package substrate 110. Electrically conductive pads 112 may be arranged on a lower surface of the semiconductor chip 120 to face the upper surface of the package substrate 110 when the semiconductor chip 120 is disposed on the package substrate 110.

With the exemplary configuration of FIG. 1 in mind, the principal upper/lower surfaces of the package substrate 110, as well as the principal upper/lower surfaces of the semiconductor chip 120, may be understood as being laterally (or horizontally) oriented according to a first horizontal direction and a second horizontal directions (e.g., an X direction and a Y direction). Hence, the semiconductor chip 120 may be understood as being vertically disposed on the package substrate 110 according to a vertical direction (e.g., a Z direction) substantially orthogonal to the first and second horizontal directions.

The conductive bumps 130 may be respectively disposed on the lower surface of the semiconductor 120 (e.g., on or over the pads 112), such that the conductive bumps 120 are interposed between the package substrate 110 and the semiconductor chip 120. At least some of the conductive bumps 130 may be configured to electrically connect the upper conductive pattern of the package substrate 110 with the pads 112. Thus, in operational effect, various conductive pattern(s) and circuitry of the semiconductor chip 120 may be electrically connected with the upper conductive pattern of the package substrate 110 via the conductive bumps 130.

The underfilling layer 150 may be interposed between the package substrate 110 and the semiconductor chip 120. Here, the underfilling layer 150 may substantially surround the respective conductive bumps 130.

The external terminals 160 (e.g., solder balls or similar conductive elements) may be disposed on the lower surface of the package substrate 110 in electrical contact with the lower conductive pattern disposed on the lower surface of the package substrate 110.

The molding member 140 may mold around (wholly or in part) the side surface(s) of the semiconductor chip 120.

In some embodiments, the molding member 140 (e.g., an epoxy molding compound or EMC) may be molded around to substantially surround the side surfaces of the semiconductor chip 120. In some embodiments, the molding member 140 may not cover any portion of the upper surface of the semiconductor chip 120, but in other embodiments, the molding member 140 may cover some or all of the upper surface of the semiconductor chip 120.

According to certain embodiments of the inventive concept, the molding member 140 may include a protruding sidewall portion that extends horizontally and outwardly (hereafter, the protruding sidewall 170). In this context, the term "outwardly" denotes a direction away from a vertical center axis of the semiconductor package. Here, the protruding sidewall 170 may be a materially integral part (or portion) of the molding member 140 produced by a conventionally understood a molding process. Once formed (as described in detail hereafter) the protruding sidewall may include an upper portion above the protruding sidewall 170 and a lower portion below the protruding sidewall portion. Each of the upper portion of the molding member 140, the lower portion of the molding member 140 and the protruding sidewall portion of the molding member 140 may have a corresponding width measured in a same horizontal direction from (e.g.,) a proximate vertical sidewall of a semiconductor device. Thus, the protruding sidewall 170 may be understood as horizontally protruding (or extending) farther from the center axis of the semiconductor package than at least one of the upper portion of the molding member 140 and the lower portion of the molding member 140.

The protruding sidewall 170 of the molding member 140 may be further understood as having an upper end 172, a lower end 174 and an outer side surface 176. Here, the upper end 172 and the lower end 174 may each outwardly and horizontally extend away from the from the semiconductor chip 120. The outer side surface 176 of the protruding sidewall of the molding member 140 may extend between the upper end 172 and the lower end 174. Thus, the outer side surface 176 may form a substantially vertical surface.

In some embodiments of the inventive concept, the molding member 140 including the protruding sidewall 170 may substantially surround all of the side surfaces of the semiconductor chip 120. (This feature is illustrated in FIG. 3). Accordingly, the molding member 140 including the protruding sidewall 170 may have a rectangular frame shape substantially surrounding the semiconductor chip 120.

As illustrated in FIG. 2, the upper end 172 of the protruding sidewall 170 may be vertically offset below an upper surface of the molding member 140 (which may, in some embodiments, be coplanar with the upper surface of the semiconductor chip 120). In some embodiments, the vertical offset distance (L1) between the upper surface of the molding member 140 and the upper end 172 of the protruding sidewall 170 will be at least about 20 µm, however the scope of the inventive concept is not limited thereto.

Here, the lower end 174 of the protruding sidewall 170 horizontally and outwardly extends away from the semiconductor chip 120 at a first vertical height substantially coplanar with (or defined by) a lower surface of the molding member 140 which is coplanar with the lower surface of the semiconductor chip 120.

FIGS. 4 to 7 are related cross-sectional views illustrating in one example a method of manufacture for the semiconductor package of FIG. 1.

Figure 4:
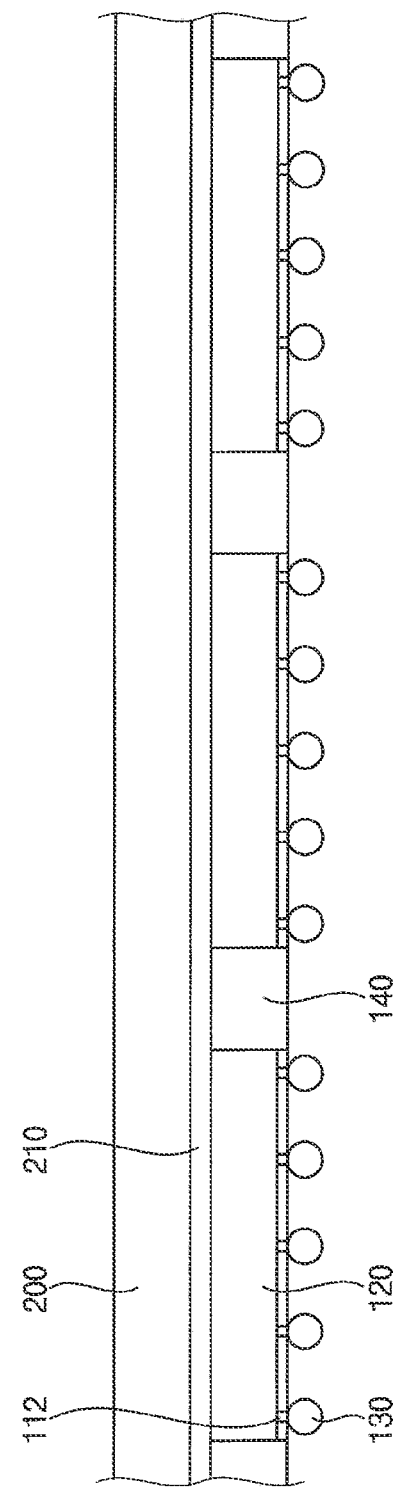
FIGS. 4, 5, 6 and 7 (collectively, "FIGS. 4 to 7") are related cross-sectional views illustrating in one example a method of manufacture for the semiconductor package of FIG. 1.

Referring to FIG. 4, the molding member 140 may be molded around (wholly or in part) multiple semiconductor chips 120. In particularly, the molding member 140 may be formed between the side surfaces of respectively adjacent semiconductor chips 120. In this manner, the molding member 140 may substantially surround at least the side surfaces of the semiconductor chips 120.

In this regard, a molding process used to mold the molding ember 140 around the semiconductor chips 120 may be performed as part of mechanically supporting the semiconductor chips 120 during fabrication using a supporting substrate. After the molding process forming the molding member 140 is complete, the supporting substrate may be removed from the semiconductor chips 120. Then, the conductive bumps 130 may be arranged on the lower surface of each of the semiconductor chips 120. Alternately, the molding process forming the molding member 140 may be performed after arranging the conductive bumps 130 on the lower surface of the semiconductor chips 120.

As illustrated in FIG. 4, a carrier substrate 200 may be attached to the upper surfaces of the semiconductor chips 120 using an adhesive 210. With this configuration, the semiconductor chips 120 may be supported by the carrier substrate 200. Here, it should be noted that many conventionally available carrier substrates may include one or more materials such as glass, epoxy, a semiconductor material, etc.

Figure 5:
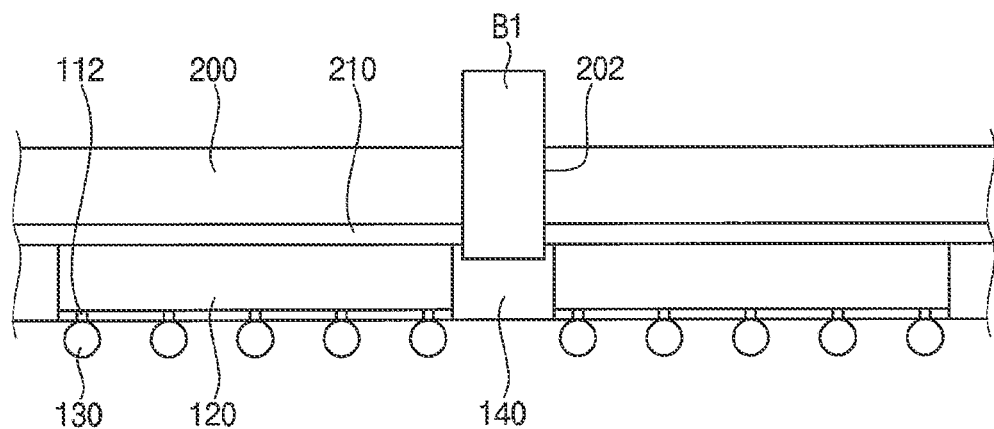

Referring to FIG. 5, selected portions of the carrier substrate 200, along with portions of the adhesive 210 underlying these selected portions of the carrier substrate 200) may be removed (or cut away) using a first blade B1. Here, the selected portions of the carrier substrate 200 removed by application of the first blade B1 may be portions of the carrier substrate 200 respectively overlaying portions of the molding member 140 disposed between adjacent ones of the semiconductor chips 120.

In this regard, the first blade B1 may penetrate from an upper surface of the carrier substrate 200 to a lower surface of the adhesive 210, thereby forming a vertically-aligned first cutting groove 202 through the carrier substrate 200 and the adhesive 210. When the carrier substrate 200 is a glass substrate, for example, the first blade B1 may be selected (e.g., from a variety of conventionally available saw blades) according to cutting characteristics optimally applied to the cutting of the glass substrate. In this regard, the generation of an edge burr or other damage to the glass substrate may be minimized or prevented by use of an appropriate blade selected as the first blade B1 in relation to the constituent material(s) of the carrier substrate 200.

According to certain embodiments of the inventive concept, during application of the first blade B1 to fully remove the selected portions of the carrier substrate 200 and the corresponding portions of the adhesive 210, the first blade B1 may partially penetrate into the upper surface of the molding member 140. Here, it should be noted that stopping the descending first blade B1 before fully removing the adhesive 210 underlaying the selected portions of the carrier substrate 200 may result in adhesive residue adhering to, and possibly clogging the first blade B1. In order to prevent clogging, a first cutting process performed with the first blade B1 should not be stopped part-way through the adhesive 210. Thus, by allowing the first blade B1 to partially penetrate into the upper surface of the molding member 140, the selected portions of the carrier substrate 200 along with corresponding portions of the adhesive 210 may be fully and cleanly removed. As a result of this approach, a first width of the first cutting groove 202 may be particularly defined by appropriate selection of the first blade B1 having a first blade-width substantially equal to the desired first width.

Figure 6:
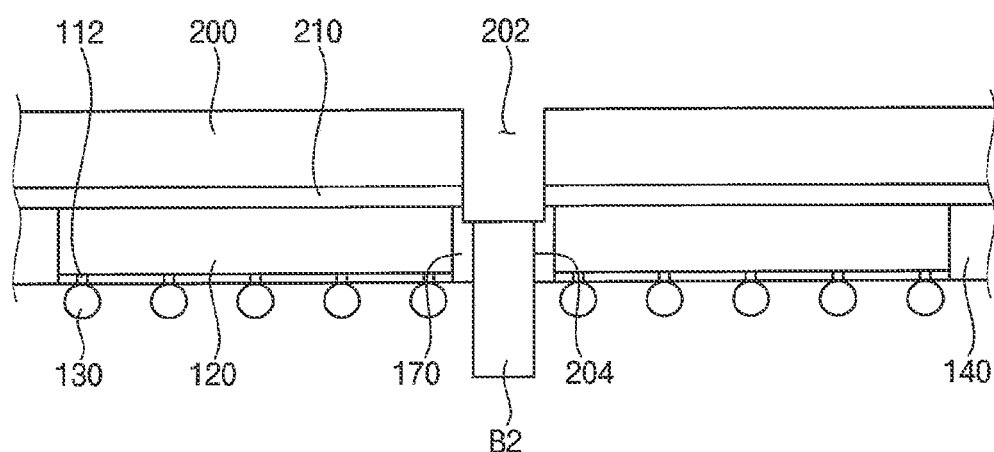

Referring to FIG. 6, a second cutting process using a second blade B2 may be applied to selected portions of the molding member 140 between adjacent ones of the semiconductor chips 120. Here, the second blade B2 may be selected according to optimal cutting characteristics relative to the material(s) forming the molding member 140, and may be characterized by a second blade-width, different from (e.g., more narrow than) the first blade-width.

In its operational application, the second blade B2 may pass through the thickness of the molding member 140 to form a vertically-aligned, second cutting groove 204. Here, in some embodiments, because the second blade-width of the second blade B2 is narrower than the first blade-width of the first blade B1, the second cutting groove 204 will be narrower than the first cutting groove 202. Using this dual cutting approach as one example, the molding member 140 including the protruding sidewall 170 and described above in relation to FIGS. 1, 2 and 3 may be formed.

Thus, the second cutting groove 204 may pass into the first cutting groove 202 to effectively divide adjacent semiconductor chips 120 one from the other. Yet, the divided semiconductor chips 120 remain well supported by the carrier substrate 200. Alternately, the second cutting process using the second blade B2 may be performed before the first cutting process using the first blade B1.

Figure 7:
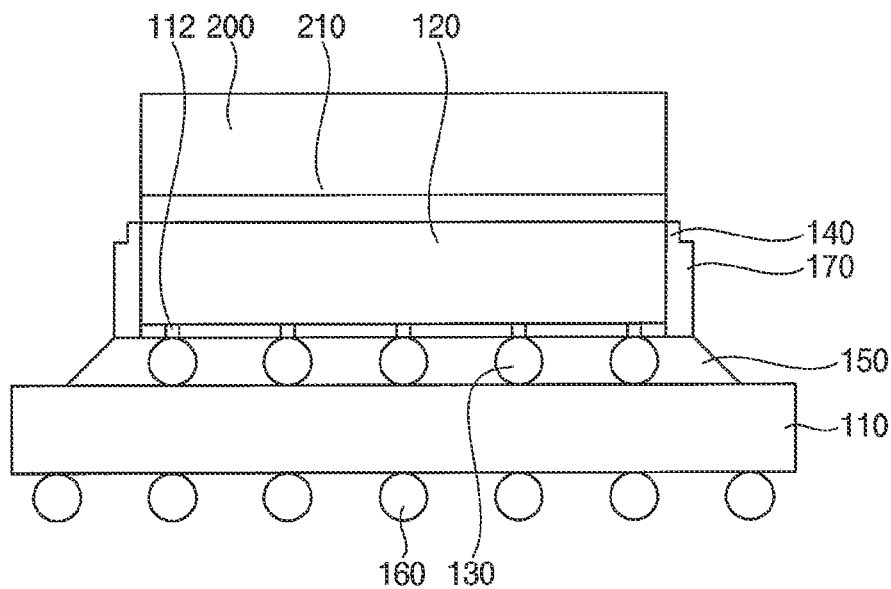

Referring to FIG. 7, the semiconductor chip 120 still supported by the carrier substrate 200, may be flipped and mounted (e.g., bonded) to the package substrate 110 via the conductive bumps 130. That is, once the supported semiconductor chip 120 is flipped, the conductive bumps 130—now on the lower surface of the semiconductor chip 120—may be electrically connected to the upper conductive pattern on the upper surface of the package substrate 110. In this regard, for example, a reflow process may be applied to electrically connect the conductive bumps 130 to the upper conductive pattern on the upper surface of the package substrate 110. During the reflow process, the semiconductor chip 120 may be compressed to (e.g., mounted on) the package substrate 110.

As noted above, some material(s) warpage may occur during the reflow process, as conventionally applied to a semiconductor chip. However, according to embodiments of the inventive concept, the carrier substrate 200 supporting the semiconductor chip 120 has the effect of suppressing or preventing warpage of the semiconductor chip 120. Furthermore, the risk of warpage in the semiconductor chip 120 may be prospectively guarded against by appropriately selecting a thickness of the carrier substrate 200 and/or a thickness of the adhesive 210.

Here, it should be noted that the carrier substrate 200 may be detached from the semiconductor chip 120 to complete the semiconductor package 100 of FIG. 1. For example, a laser may be selective applied to the adhesive 210 in order to weaken its adhesive strength. Once the adhesive strength of the adhesive 210 has been sufficiently weakened, the carrier substrate 200 may be readily detached from the semiconductor chip 120 without risk of damage to the semiconductor chip 120.

Figure 8:
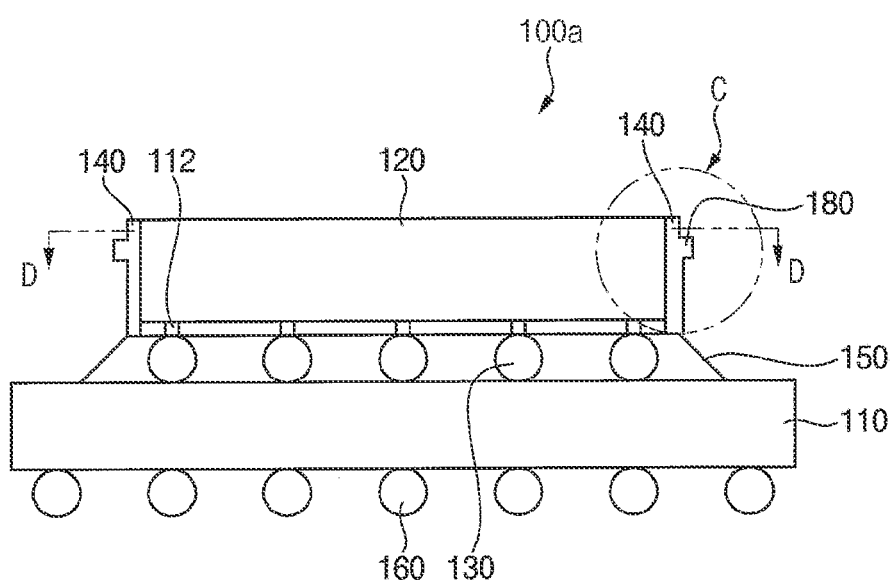
FIG. 8 is a cross-sectional view illustrating a semiconductor package according to embodiments of the inventive concept.
Figure 9:
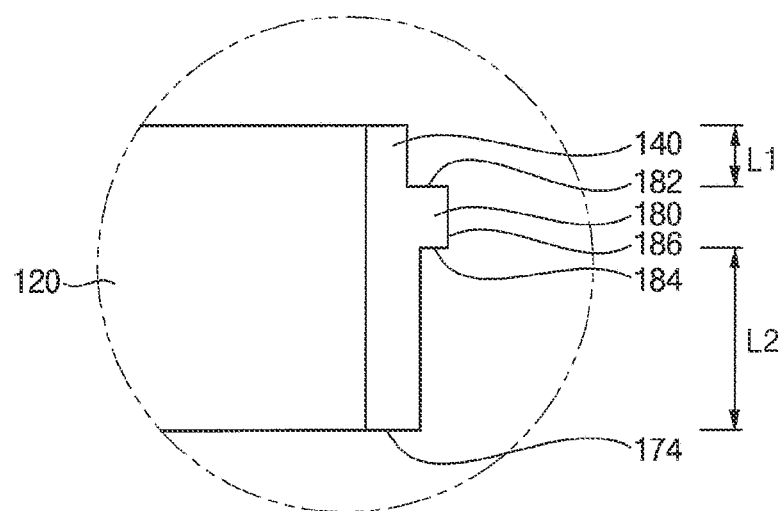
FIG. 9 is an enlarged, cross-sectional view of portion "C" in FIG. 8.

FIG. 8 is a cross-sectional view illustrating a semiconductor package 100a in accordance with embodiments of the inventive concept. FIG. 9 is an enlarged, cross-sectional view of portion "C" in FIG. 8, and FIG. 10 is a cross-sectional view taken along line D-D' in FIG. 8.

The semiconductor package 100a of FIG. 8 may include substantially the same elements as those described in relation to the semiconductor package 100 of FIG. 1, except that the shape of the protruding sidewall is different.

Figure 10:
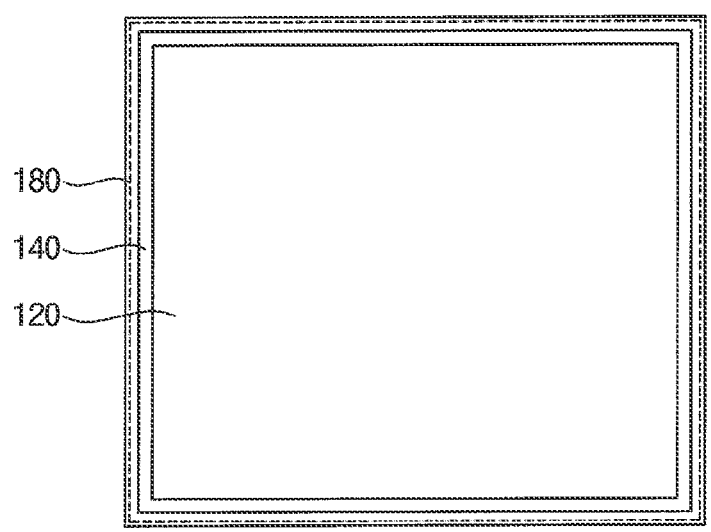
FIG. 10 is a cross-sectional view taken along line D-D' in FIG. 8.

Referring to FIGS. 8, 9 and 10, the molding member 140 includes a protruding sidewall 180 having an upper end 182, a lower end 184 and an outer side surface 186. Here, the upper end 182 of the protruding sidewall 180 is substantially the same as the upper end 172 of the protruding sidewall 170 described in relation to FIGS. 1, 2 and 3. However, the lower end 184 of the protrusion 180 horizontally and outwardly extends away from the semiconductor chip 120 at a second vertical height well above the first vertical height associated with plane defined by the lower surface 174 of the molding member 140 and the lower surface of the semiconductor chip 120.

Thus, the vertical length of the outer side surface 186 of the protruding sidewall 180 is substantially shorter than the outer side surface 176 of the protruding sidewall 170.

With his configuration, the upper end 182 of the protruding sidewall 180 may again vertically offset by the distance L1 (e.g., at least about 20 μm) from the upper surface of the molding member 140. However, the lower end 184 of the protruding sidewall 180 may be further vertically offset above the lower surface 174 of the molding member 140 by a distance L2. In some embodiments, the second distance L2 may also be at least about 20 μm, but the scope of the inventive concept is not limited thereto.

Here, the degree of horizontal and outward extension by the upper end 182 of the protruding sidewall 180 may be different from (e.g., greater than) the degree of horizontal and outward extension of the lower end 184 of the protruding sidewall 180.

FIGS. 11 to 15 are related cross-sectional vies illustrating in one example a method of manufacture for the semiconductor package of FIG. 8.

Figure 11:
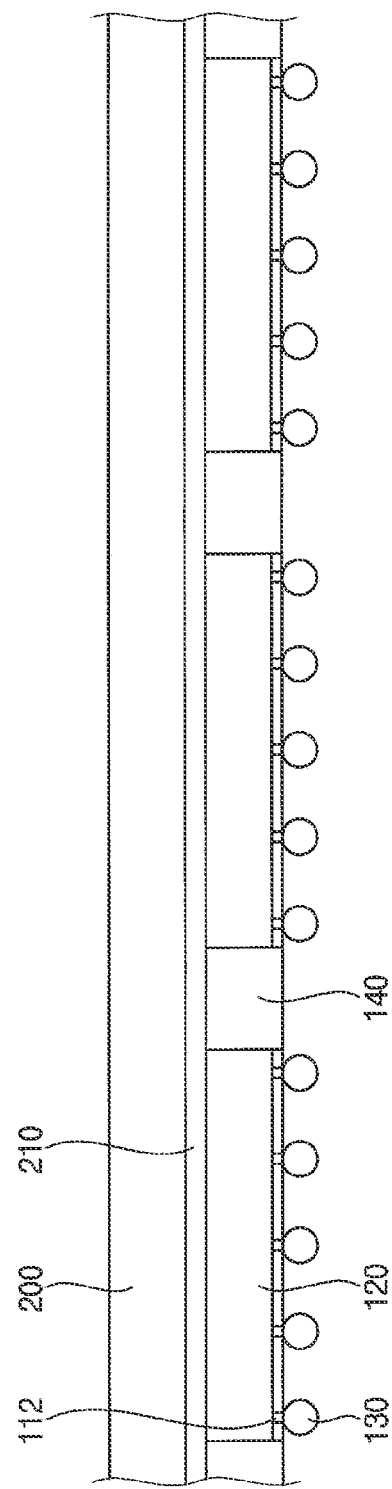
FIGS. 11, 12, 13, 14 and 15 (collectively, "FIGS. 11 to 15") are related cross-sectional views illustrating in one example a method of manufacture for the semiconductor package of FIG. 8.

Referring to FIG. 11, the molding member 140 is molded (wholly or in part) around multiple semiconductor chips 120, and the conductive bumps 130 may be arranged on the lower surface of each of the semiconductor chips 120.

A carrier substrate 200 is again attached to the upper surfaces of the semiconductor chips 120 using the adhesive 210 in order to support the semiconductor chips 120.

Figure 12:
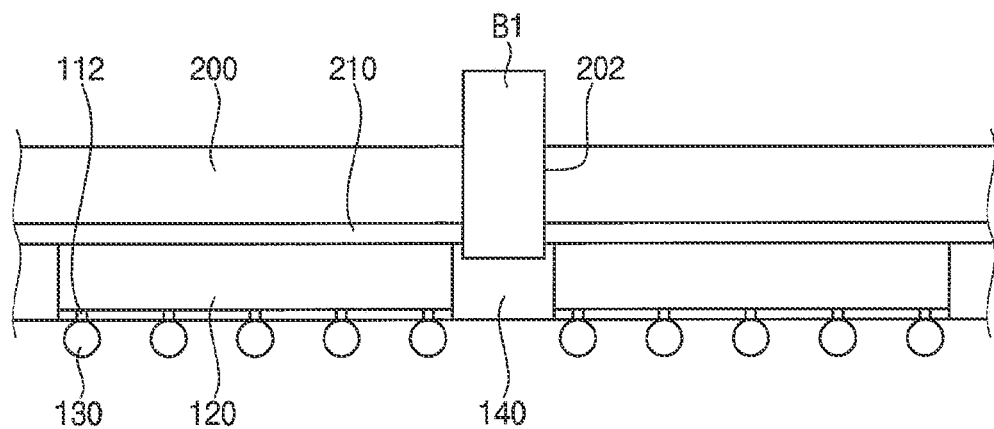

Referring to FIG. 12, selected portions of the carrier substrate 200 (along with corresponding portions of the adhesive 210) overlaying portions of the molding member 140 between adjacent ones of the semiconductor chips 120 are removed (e.g., cut away) using the first blade B1.

Figure 13:
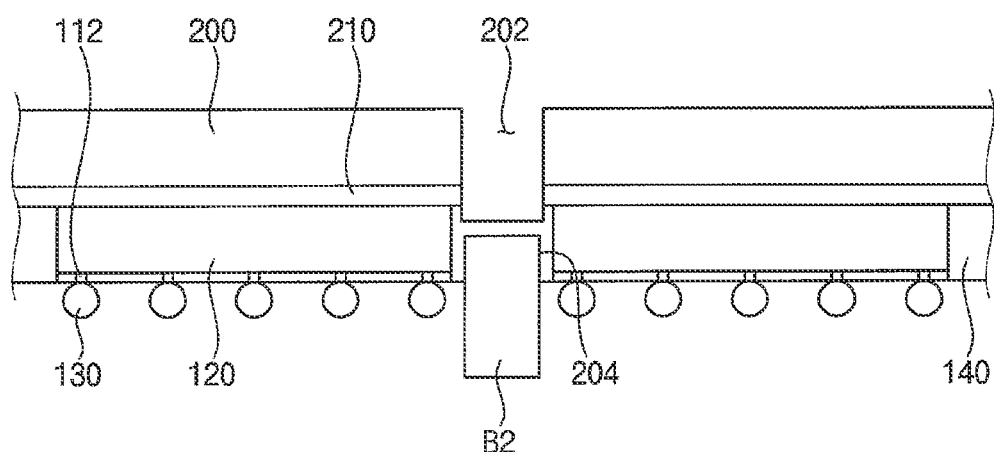

Here again as described in relation to FIG. 5, the first blade B1 is allowed to slightly penetrate into the upper surface of the molding member 140 to fully and cleanly remove portions of the adhesive 210 underlying the selected portions of the carrier substrate 200. Referring to FIG. 13, the second blade B2 is similarly applied to portions of the molding member 140 between adjacent ones of the semiconductor chips 120, as described in relation to FIG. 6—however the second cutting process performed by the second blade B2 does not completely penetrate the molding member 140. Here, the second blade B2 may have the second blade-width narrower than the first blade-width of the first blade B1, thus yielding the second cutting groove 204 having a second width narrower than a first width of the first cutting groove 202 formed by the first blade B1.

Figure 14:
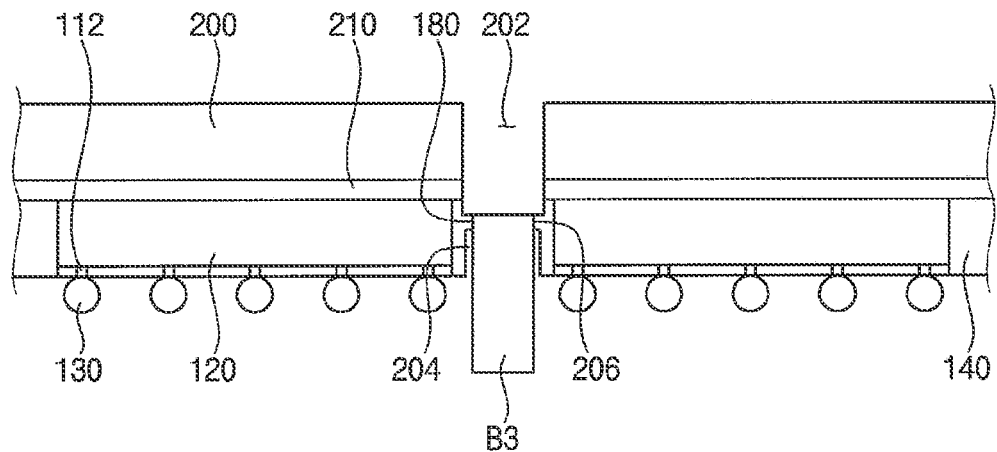

Referring to FIG. 14, a third blade B3 may be applied to a remaining portion of the molding member 140 in second cutting groove 204 between the adjacent ones of the semiconductor chips 120 to form a third cutting groove 206. Here, the combination of the first cutting groove 202, the second cutting groove 204 and finally, the third cutting groove 206 effectively divides the adjacent the semiconductor chips 120 one from the other. However, the divided semiconductor chips 120 remain supported by portions of the carrier substrate 200.

The third blade B3 may have a third blade-width narrower than the second blade-width of the second blade B2. Accordingly, the third cutting groove 206 formed by the third blade B3 will be narrower than the second cutting groove 204. As a result, the protruding sidewall 180 may be formed having the shape described in relation to FIGS. 8, 9 and 10.

Alternately, after performing the second and third cutting processes using the second blade B2 and the third blade B3, the first cutting process using the first blade B1 may be performed.

Figure 15:
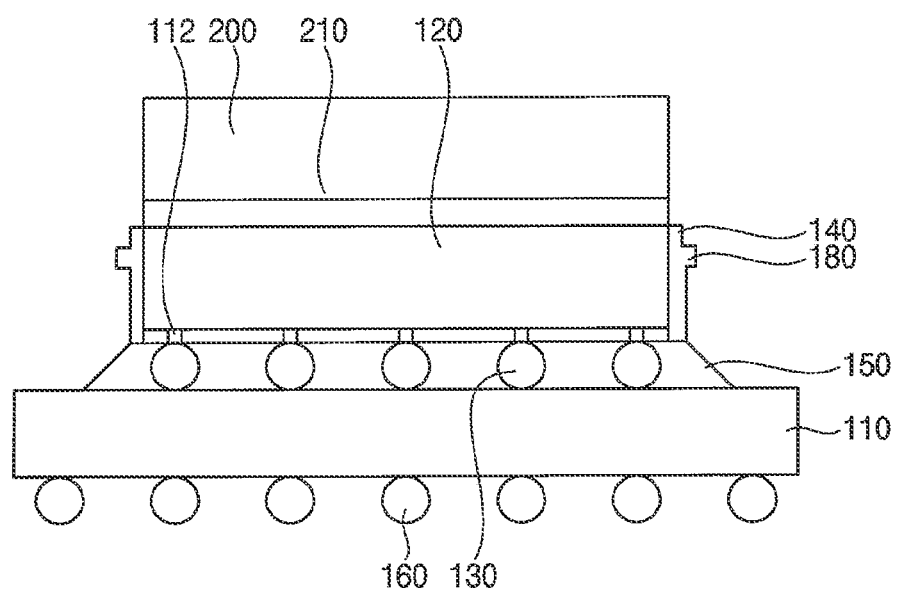

Referring to FIG. 15, the semiconductor chip 120 supported by the carrier substrate 200 may be bonded to the package substrate 110 via the conductive bumps 130 as previously described in relation to FIG. 7.

Figure 16:
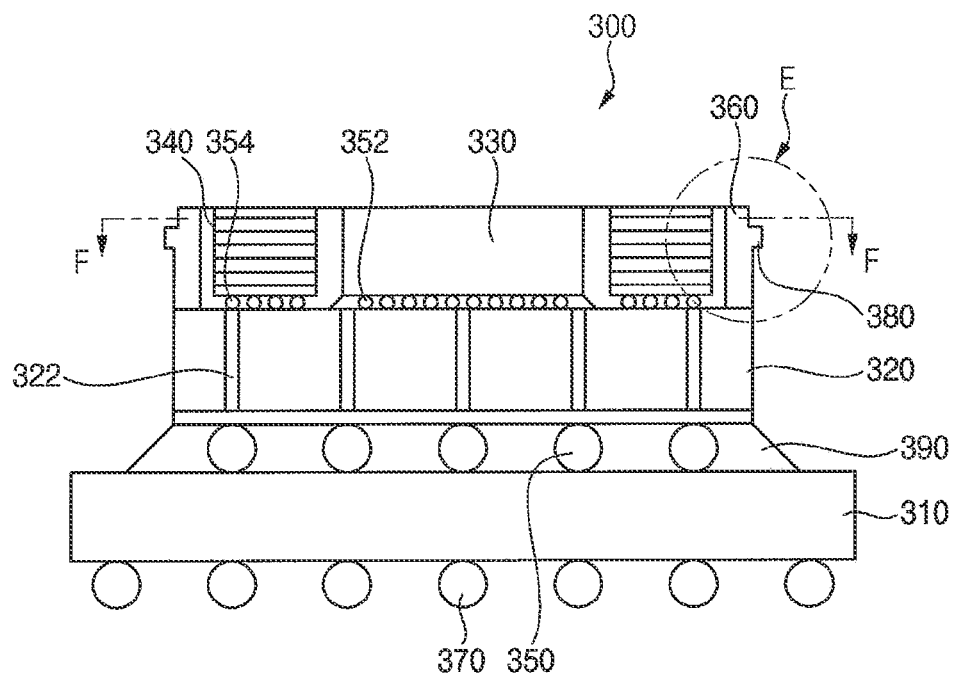
FIG. 16 is a cross-sectional view illustrating a semiconductor package according to embodiments of the inventive concept.
Figure 17:
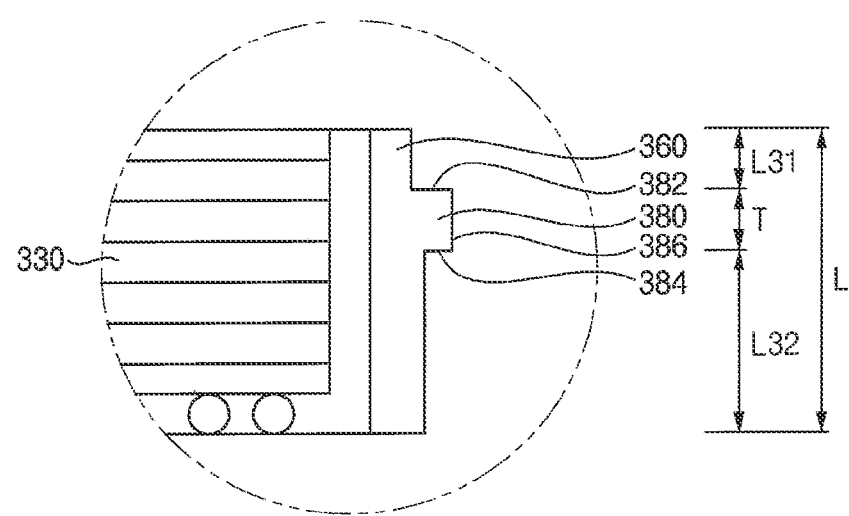
FIG. 17 is an enlarged, cross-sectional view of portion "E" in FIG. 16.

FIG. 16 is a cross-sectional view illustrating a semiconductor package 300 according to embodiments of the inventive concept. FIG. 17 is an enlarged cross-sectional view of portion "E" in FIG. 16, and FIG. 18 is a cross-sectional view taken along line F-F' in FIG. 16.

Figure 18:
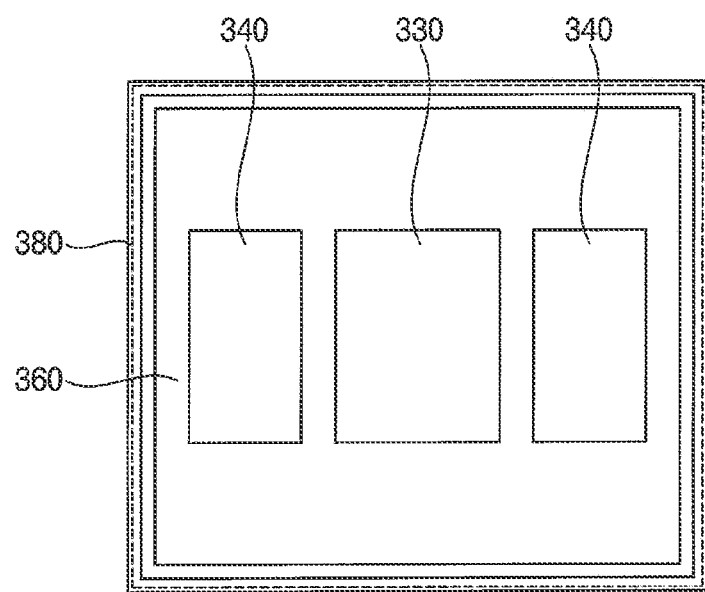
FIG. 18 is a cross-sectional view taken along line F-F' in FIG. 16.

Referring to FIGS. 16, 17 and 18, the semiconductor package 300 may be a 2.5D stack type semiconductor package that includes a package substrate 310, an interposer 320, at least one first semiconductor chip 330, a plurality of second semiconductor chips 340, a molding member 360 and external terminals 370.

The interposer 320 may be disposed on an upper surface of the package substrate 310, and be electrically connected with the package substrate 310 via conductive bumps 350. Connection vias 322 may be vertically arranged in relation to the interposer 320, wherein upper ends of the connection vias 322 are exposed through an upper surface of the interposer 320 and lower ends of the connection vias 322 may be exposed through a lower surface of the interposer 320.

The first semiconductor chip 330 may be arranged on the upper surface of the interposer 320. The first semiconductor chip 330 may be electrically connected with the interposer 320 via first conductive bumps 352. That is, the first semiconductor chip 330 may be electrically connected with the upper ends of the connection vias 322 via the first conductive bumps 352. The first semiconductor chip 330 may be a central processing unit (CPU), a graphic processing unit (GPU), etc.

The plurality of second semiconductor chips 340 may be vertically stacked on the upper surface of the interposer 320. In some embodiments, separate stacked pluralities of the second semiconductor chips 340 may be arranged on opposing sides of the first semiconductor chip 330. In this regard, the embodiment of FIG. 16 includes a first stacked plurality of second semiconductor chips 340 and a second stacked plurality of second semiconductor chips, as one illustrative example. Here, each stacked plurality of second semiconductor chips 340 may be electrically connected with the interposer 320 via second conductive bumps 354. That is, each stacked plurality of second semiconductor chips 340 may be electrically connected with the upper ends of the connection vias 322 via the second conductive bumps 354. The second semiconductor chips 340 may be high-bandwidth memory (HBM) chips, for example.

An underfilling layer 390 may be interposed between the package substrate 110 and the interposer 320. The underfilling layer 390 may be configured to substantially surround each of the lower conductive bumps 350 between the package substrate 310 and the interposer 320.

The external terminals 370 (e.g., solder balls or similar elements) may be mounted on the lower surface of the package substrate 310. Here, the external terminals 370 may electrically contact with lower ends of the conductive patterns exposed through a lower surface of the package substrate 310.

The molding member 360 (e.g., an epoxy molding compound or EMC) may be disposed on the upper surface of the interposer 320 and may be molded around and in between the first semiconductor chip 330, the first stacked plurality of second semiconductor chips 340 and the second stacked plurality of second semiconductor chips 340. In particular, the molding member 360 may be interposed between the first semiconductor chip 330 and each one of the stacked pluralities of second semiconductor chips 340, as illustrated in FIG. 18.

Similar to the embodiment described in relation to FIGS. 8, 9 and 10, the molding member 360 of FIGS. 16, 17 and 18 includes a protruding sidewall 380. The protruding sidewall 380 may include an upper end 382, a lower end 384 and an outer side surface 386. The upper end 382 of the protruding sidewall 380 may horizontally extend outwardly away from the first semiconductor chip 330. The lower end 384 of the protruding sidewall 380 may also horizontally extend outwardly away from the first semiconductor chip 330. The outer side surface 386 of the protruding sidewall 380 may vertically extend between the upper ends 382 of the protruding sidewall 380 with the lower end 384 of the protruding sidewall 380.

Assuming a vertical height of L (e.g., that ranges from about 800 µm to about 900 µm) between the upper surface of the package substrate 310 and the upper surface of the molding member 360, the upper end 382 of the protruding sidewall 380 may be vertically offset below the upper surface of the molding member 360 by a first distance L31 (e.g., at least about 20 µm). Further, the lower end 384 of the protruding sidewall 380 may be vertically offset above the lower surface of the molding member 360 by a second distance L32 (e.g., at least about 20 µm).

Accordingly, a vertical height (T) of the outer side surface 386 may be determined in accordance with the first distance L31 between the upper surface of the molding member 360 and the upper end 382 of the protruding sidewall 380 and the second distance L32 between the lower surface of the molding member 360 and the lower end 384 of the protruding sidewall 380.

It should be noted that an upper protruding width (measured in a horizontal direction) of the upper end 382 in the protruding sidewall 380 may be different (e.g., greater than) a lower protruding width (measured in the same horizontal direction) of the lower end 384 in the protruding sidewall 380.

FIGS. 19 to 23 are related cross-sectional views illustrating in one example a method of manufacture for the semiconductor package of FIG. 16.

Figure 19:
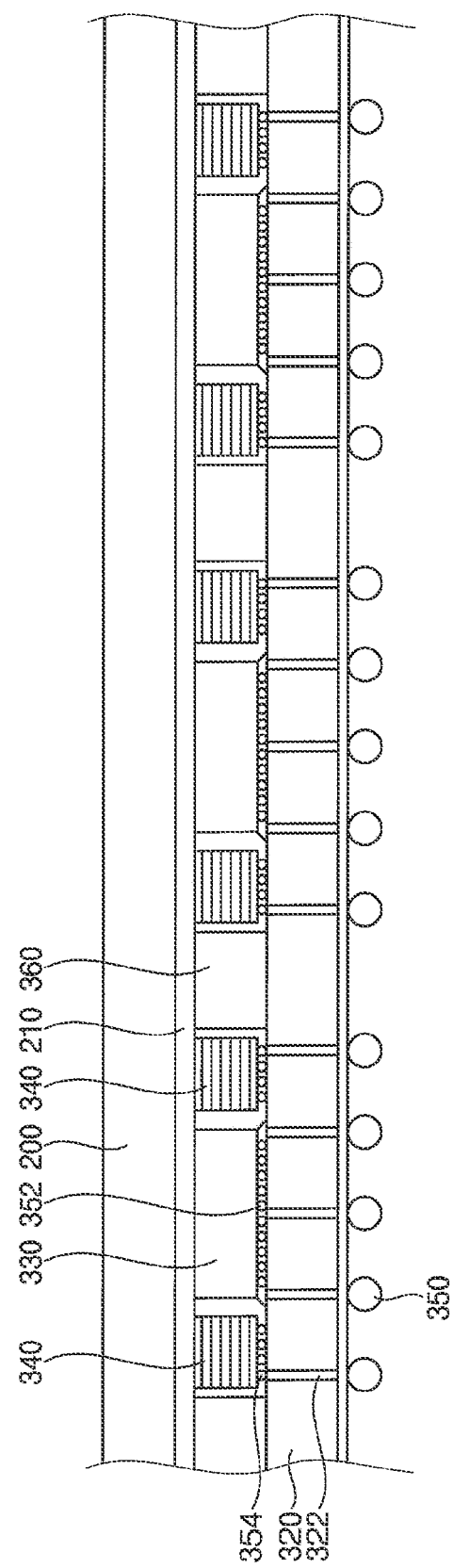
FIGS. 19, 20, 21, 22 and 23 (collectively, "FIGS. 19 to 23") are related cross-sectional views illustrating in one example a method of manufacture for the semiconductor package of FIG. 16.

Referring to FIG. 19, the first semiconductor chip 330 and the stacked pluralities of second semiconductor chips 340 may be arranged on the upper surface of the interposer 320. That is, the first semiconductor chip 330 and the stacked pluralities of second semiconductor chips 340 may be arranged in respective package regions on the upper surface of the interposer 320. In these package regions, for example, stacked pluralities of second semiconductor chips 340 may be disposed on opposing sides of the first semiconductor chip 330. The lower conductive bumps 350 may be arranged on the lower surface of the interposer 320. The molding member 360 may molded around the first semiconductor chip 330 and the stacked pluralities of second semiconductor chips 340.

A carrier substrate 200 may be attached to the upper surfaces of the first and second semiconductor chips 330 and 340 and the upper surface of the molding member 360 using an adhesive 210. Thus, the interposer 320 and the first and second semiconductor chips 330 and 340 may be supported by the carrier substrate 200.

Figure 20:
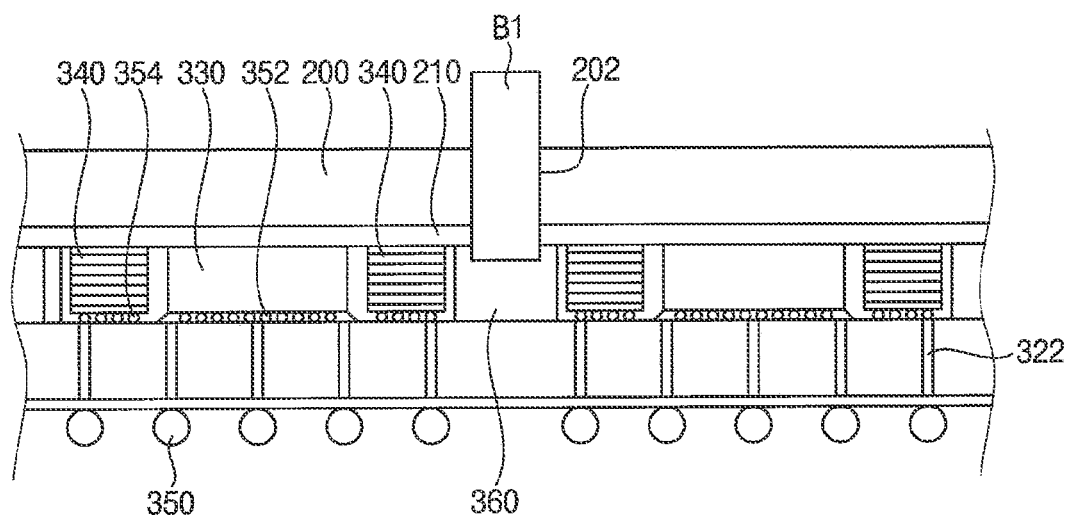

Referring to FIG. 20, selected portions of the carrier substrate 200 along with underlying portions of the adhesive 210 disposed over portions of the molding member 360 between the second semiconductor chips 340 may be removed (e.g., cut away) using the first blade B1. In this regard, the first blade B1 may be selected and used in a manner similar to that previously described in relation to FIG. 12 to form a first cutting groove 202.

Figure 21:
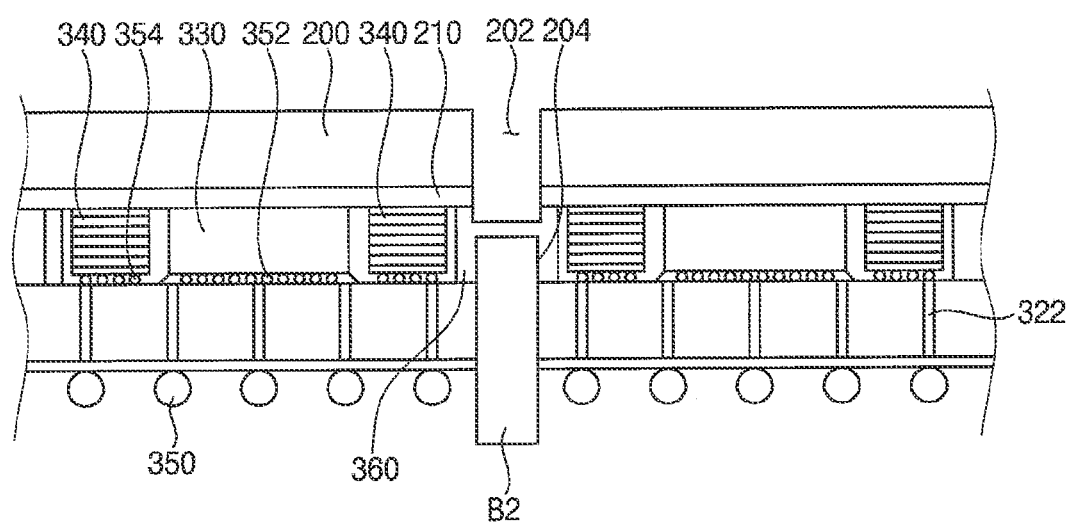

Referring to FIG. 21, the second blade B2 may be selected and used to cut through the interposer 320 and a selected portion of the molding member 360 between adjacent, stacked pluralities of second semiconductor chips 340. Here, the second blade B2 may have a second blade-width narrower than a first blade-width of the first blade B1.

Thus, the second blade B2 may penetrate completely through the interposer 320 and partially through the molding member 140 to form a second cutting groove 204. As the second blade-width of the second blade B2 is narrower than the first blade-width of the first blade B1, the second cutting groove 204 will be narrower than the first cutting groove 202. Here, the interposer 320 may include different material (s) than those used in the molding member 360. Further, a summed vertical thicknesses of the interposer 320 and the molding member 360 may be relatively thicker than the material layer thicknesses previously implicated in the previous embodiments. Accordingly, the combination of the interposer 320 and at least part of the molding member 360 may not be readily cut using the second blade B2.

Figure 22:
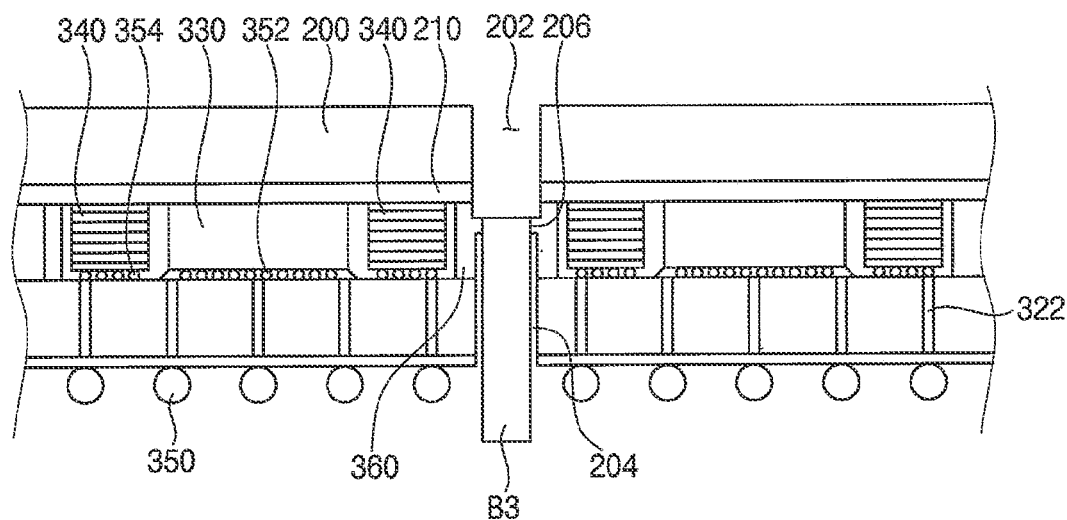

Referring to FIG. 22, the third blade B3 may be used to cut a remaining portion of the molding member 360 between the adjacent stacked pluralities of the second semiconductor chips 340 in order to completely form the third cutting groove 206. Thus, the combination of the first cutting groove 202, the second cutting groove 204 and the third cutting groove 206 may be used to divide adjacent stacked pluralities of second semiconductor chips 340 one from the other. Using this approach, multiple package structures may be obtained, each including a cut portion of the interposer 320, the first semiconductor chip 330 and at least one stacked plurality of second semiconductor chips 340. Here again, each one of the resulting package structures will be supported by the carrier substrate 200.

As previously described, the third blade B3 may have a third blade-width narrower than the second blade-width of the second blade B2. Thus, the third cutting groove 206 formed by the third blade B3 may be narrower than the second cutting groove 204. As a result, the molding member 360 surrounding the combination of the first semiconductor chip 330 and at least one stacked plurality of second semiconductor chips 340 will include the protruding sidewall 380 having the shape described above and illustrated (e.g.,) in FIG. 17.

Alternately, after performing the second and third cutting processes respectively using the second blade B2 and the third blade B3, the first cutting process using the first blade B1 may be performed.

Figure 23:
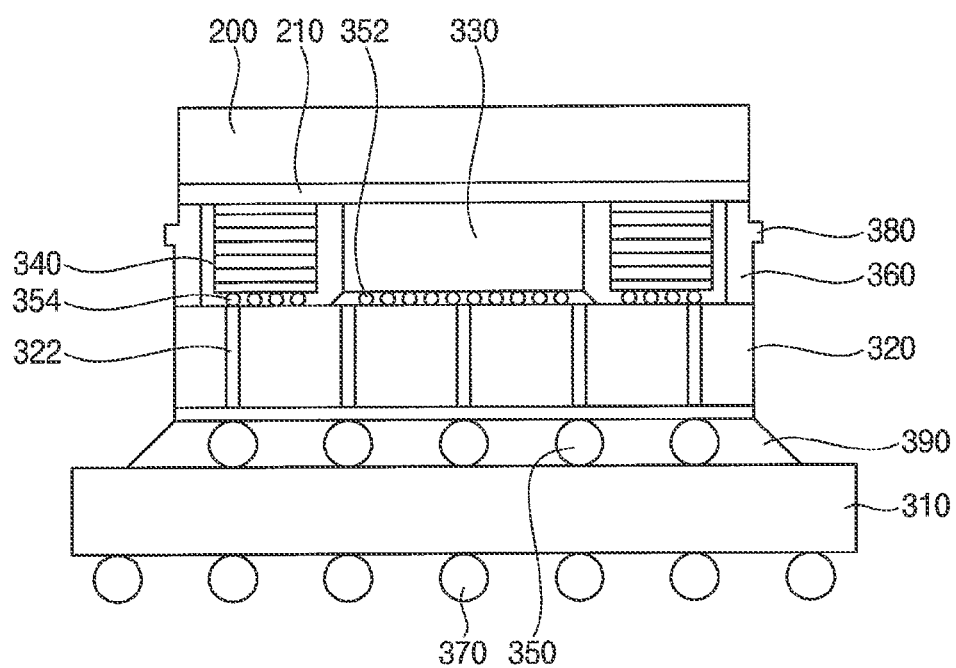

Referring to FIG. 23, the package structure supported by the carrier substrate 200 may be bonded to the package substrate 310 via the conductive bumps 350. Particularly, the lower conductive bumps 350 on the lower surface of the interposer 320 may be arranged on the upper surface of the package substrate 310. A reflow process may be performed on the conductive bumps 350, and simultaneously, the interposer 320 may be compressed to the package substrate 310.

Noting again the possibility of warpage generated at the interposer 320 during the reflow process, embodiments of the inventive concept use a cut portion of the carrier substrate 200 to support the interposer 320, thereby suppressing warpage. Additionally, the risk of warpage associated with the interposer 320 may be controlled by appropriately selecting a thickness of the carrier substrate 200 and/or a thickness of the adhesive 210.

The underfilling layer 390 may be formed between the interposer 320 and the package substrate 310 to surround the lower conductive bumps 350 with the underfilling layer 390. The external terminals 370 may be mounted on the lower surface of the package substrate 310.

The carrier substrate 200 may then be detached, as previously described, from the package structure to complete the semiconductor package 300 in FIG. 17.

According to embodiments of the inventive concept, a carrier substrate may be attached to an upper surface of the semiconductor chip or an upper surface of the semiconductor chip over an interposer using adhesive. The semiconductor chip or the interposer—as supported by the carrier substrate—may then be bonded to a package substrate while possible material(s) warpage associated with the semiconductor chip and/or the interposer are suppressed. In this manner, the warpage of the semiconductor chip and/or the interposer may be suppressed regardless of the size of the semiconductor chip or the interposer.

Additionally, warpage of the semiconductor chip and/or the interposer may be controlled by appropriately selecting a thickness of the carrier substrate and/or a thickness of the adhesive.

The foregoing embodiments should be considered illustrative and not limiting in nature. Although a few embodiments have been described, those skilled in the art will readily appreciate that many modifications are possible in the embodiments without materially departing from the novel teachings and advantages of the inventive concept. Accordingly, all such modifications are intended to fall within the scope of the following claims.

What is claimed is:

1. A method of manufacture for a semiconductor package, the method comprising:
    arranging at least one semiconductor chip on an upper surface of an interposer;
    forming a molding member on side surfaces of the at least one semiconductor chip;
    using an adhesive to attach a carrier substrate to an upper surface of the molding member and an upper surface of the at least one semiconductor chip;
    using a first blade having a first blade-width to cut away selected portions of the carrier substrate and cut away portions of the adhesive underlying the selected portions of the carrier substrate, and using the first blade to partially cut into an upper surface of the molding member to form a first cutting groove, wherein the selected portions of the carrier substrate are disposed above portions of the molding member;
    using a second blade having a second blade-width narrower than the first blade-width to cut through the interposer and at least partially into a lower surface of the molding member to form a second cutting groove, wherein a combination of the first cutting groove and the second cutting groove separates a package structure including a cut portion of the interposer and the at least one semiconductor chip, collectively supported by a cut portion of the carrier substrate; and
    bonding the package structure to an upper surface of a package substrate.

2. The method of claim 1, wherein arranging the at least one semiconductor chip on the upper surface of the interposer further comprises arranging a first stacked plurality of second semiconductor chips and a second stacked plurality of second semiconductor chips on the upper surface of the interposer.

3. The method of claim 2, wherein forming the molding member further comprises forming the molding member on side surfaces of the first stacked plurality of second semiconductor chips and the second stacked plurality of second semiconductor chips.

4. The method of claim 3, wherein attaching the carrier substrate further comprises attaching the carrier substrate to an upper surface of the first stacked plurality of second semiconductor chips and an upper surface of the second stacked plurality of second semiconductor chips.

5. The method of claim 4, wherein the selected portions of the carrier substrate are disposed above the portions of the molding member between the first stacked plurality of second semiconductor chips and the second stacked plurality of second semiconductor chips.

6. The method of claim 5, wherein the combination of the first cutting groove and the second cutting groove separates the package structure including the first stacked plurality of second semiconductor chips.

7. The method of claim 1, further comprising:
using a third blade having a third blade-width narrower than the second blade-width to cut through a remaining portion of the lower surface of the molding member in the second cutting groove to form a third cutting groove, wherein a combination of the first cutting groove, the second cutting groove and the third cutting groove separates the package structure.

8. A method of manufacture for a semiconductor package, the method comprising:
forming a molding member on side surfaces of semiconductor chips;
using an adhesive to attach a carrier substrate to an upper surface of the molding member and an upper surface of the semiconductor chips;
using a first blade having a first blade-width to cut away selected portions of the carrier substrate and portions of the adhesive underlying the selected portions of the carrier substrate, and to partially cut into an upper surface of the molding member to form a first cutting groove, wherein the selected portions of the carrier substrate are dispose above portions of the molding member between adjacent ones of the semiconductor chips;
using a second blade having a second blade-width narrower than the first blade-width to cut through a lower surface of the molding member to form a second cutting groove, wherein a combination of the first cutting groove and the second cutting groove separate a package structure including a semiconductor chip supported by a cut portion of the carrier substrate; and
bonding the package structure to an upper surface of a package substrate.

9. The method of claim 8, wherein the carrier substrate is a glass substrate.

10. The method of claim 8, further comprising:
detaching the cut portion of the carrier substrate from the semiconductor chip by irradiating the adhesive with a laser to weaken an adhesive strength of the adhesive.

11. A method of manufacture for a semiconductor package, the method comprising:
arranging a first semiconductor chip, a first stacked plurality of second semiconductor chips and a second stacked plurality of second semiconductor chips on an upper surface of an interposer;
forming a molding member on side surfaces of the first semiconductor chip, the first stacked plurality of second semiconductor chips and the second stacked plurality of second semiconductor chips;
using a first blade having a first blade-width to partially cut into an upper surface of the molding member to form a first cutting groove;
using a second blade having a second blade-width narrower than the first blade-width to cut through the interposer and at least partially into a lower surface of the molding member to form a second cutting groove, wherein a combination of the first cutting groove and the second cutting groove separates a package structure including a cut portion of the interposer, the first semiconductor chip and the first stacked plurality of second semiconductor chips; and
bonding the package structure to an upper surface of a package substrate.

12. The method of claim 11, further comprising using an adhesive to attach a carrier substrate to the upper surface of the molding member, an upper surface of the first semiconductor chip, an upper surface of the first stacked plurality of second semiconductor chips and an upper surface of the second stacked plurality of second semiconductor chips.

13. The method of claim 12, wherein the carrier substrate is a glass substrate.

14. The method of claim 12, further comprising using the first blade to cut away selected portions of the carrier substrate and cut away portions of the adhesive underlying the selected portions of the carrier substrate, wherein the selected portions of the carrier substrate are disposed above portions of the molding member.

15. The method of claim 11, further comprising:
using a third blade having a third blade-width narrower than the second blade-width to cut through a remaining portion of the lower surface of the molding member in the second cutting groove to form a third cutting groove, wherein a combination of the first cutting groove, the second cutting groove and the third cutting groove separates the package structure.

16. A method of manufacture for a semiconductor package, the method comprising:
providing a first semiconductor chip, a first stacked plurality of second semiconductor chips and a second stacked plurality of second semiconductor chips;
forming a molding member on side surfaces of the first semiconductor chip, the first stacked plurality of second semiconductor chips and the second stacked plurality of second semiconductor chips;
using an adhesive to attach a carrier substrate to an upper surface of the molding member, an upper surface of the first semiconductor chip, an upper surface of the first stacked plurality of second semiconductor chips and an upper surface of the second stacked plurality of second semiconductor chips;
using a first blade having a first blade-width to cut away selected portions of the carrier substrate and cut away portions of the adhesive underlying the selected portions of the carrier substrate, and using the first blade to partially cut into an upper surface of the molding member to form a first cutting groove, wherein the selected portions of the carrier substrate are dispose above portions of the molding member between the first stacked plurality of second semiconductor chips and the second stacked plurality of second semiconductor chips;
using a second blade having a second blade-width narrower than the first blade-width to cut through an interposer and at least partially into a lower surface of the molding member to form a second cutting groove, wherein a combination of the first cutting groove and the second cutting groove separate a package structure including the first semiconductor chip and the first stacked plurality of second semiconductor chips, collectively supported by a cut portion of the carrier substrate; and
bonding the package structure to an upper surface of a package substrate.

17. The method of claim 16, wherein providing the first semiconductor chip, the first stacked plurality of second semiconductor chips and the second stacked plurality of second semiconductor chips comprises arranging the first semiconductor chip, the first stacked plurality of second semiconductor chips and the second stacked plurality of second semiconductor chips on an upper surface of the interposer.

18. The method of claim 17, wherein the package structure further comprises a cut portion of the interposer.

19. The method of claim 16, wherein the carrier substrate is a glass substrate.

20. The method of claim 16, further comprising:
using a third blade having a third blade-width narrower than the second blade-width to cut through a remaining portion of the lower surface of the molding member in the second cutting groove to form a third cutting groove, wherein a combination of the first cutting groove, the second cutting groove and the third cutting groove separates the package structure.

* * * * *